(12) United States Patent
Howell et al.

(10) Patent No.: US 9,097,767 B2
(45) Date of Patent: Aug. 4, 2015

(54) DC-MOTOR AND FUEL PUMP FAULTS AND BRUSH-WEAR PROGNOSIS

(75) Inventors: Mark N. Howell, Rochester Hills, MI (US); Pattada A. Kallappa, Karnataka (IN); Avoki Omekanda, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 676 days.

(21) Appl. No.: 13/346,230

(22) Filed: Jan. 9, 2012

(65) Prior Publication Data

US 2013/0179104 A1 Jul. 11, 2013

(51) Int. Cl.
*G01R 19/00* (2006.01)
*G01R 31/34* (2006.01)
*G06F 19/00* (2011.01)
*G01R 31/00* (2006.01)

(52) U.S. Cl.
CPC ............ *G01R 31/343* (2013.01); *G01R 31/007* (2013.01)

(58) Field of Classification Search
CPC .. G01R 31/343; G01R 31/021; G01R 31/007; G06F 17/00
USPC ....................................... 702/64–67
See application file for complete search history.

(56) References Cited

U.S. PATENT DOCUMENTS 5,726,905 A * 3/1998 Yazici et al. ..................... 702/38
2009/0033259 A1 * 2/2009 Cesario et al. ........... 318/400.04

* cited by examiner

*Primary Examiner* — Phuong Huynh
(74) *Attorney, Agent, or Firm* — John A. Miller; Miller IP Group, PLC

(57) ABSTRACT

A system and method for determining the health of a DC motor, such as a DC motor on a vehicle. The method includes measuring a current output signal of the DC motor, determining a mean of the measured current signal over a predetermined time period and determining a variance estimation of the mean of the measured current. The method then uses the variance estimation to determine the health of the motor, including an end-of-life prediction of the motor, and uses the mean of the measured current to determine the performance (torque) of the motor.

20 Claims, 3 Drawing Sheets

DC-MOTOR AND FUEL PUMP FAULTS AND BRUSH-WEAR PROGNOSIS

BACKGROUND OF THE INVENTION

1. Field of the Invention

This invention relates generally to a system and method for determining faults and wear on an electric motor and, more particularly, to a system and method for determining faults and wear on an electric motor that includes monitoring the mean and variance of the motor current.

2. Discussion of the Related Art

DC motors provide the driving force for many consumer products. For example, DC motors are used in automobiles for controlling windows, windscreen wipers, electric power assisted steering, fuel pumps, etc. DC motors for these applications are subject to various faults and failure modes, both mechanical and electrical, and a gradual degradation of the motor, which leads to loss of motor performance. Typical faults include bearing failures, brush and commutator wear, loss of magnetic flux, winding short or open-circuit failure, magnet demagnetization, mechanical rotor eccentricities, such as bent rotor or damaged bearings, etc.

Several techniques have been developed in the art to identify these types of motor faults, such as using a frequency response, Fourier and wavelet transforms, etc. Motor current signature analysis (MCSA) is a widely used tool for condition monitoring of electrical machines. MCSA has been applied to the detection of a number of different faults in the bearings, stator and eccentricities of induction motors. This technique employs a frequency response method that can isolate the fault to the specific cause. Other known techniques provide a review of condition monitoring and fault diagnosis approaches for electrical machines.

It is desirable for vehicle motor applications to monitor the gradual degradation and failure of electric motors. However, the known techniques discussed above for accomplishing this require high sampling rates and complex signal processing, which typically are not available from a vehicle engine controller for this purpose. In many situations, it is only necessary to determine the fault of the DC motor and is not necessary to root cause the fault to the level of the specific fault. In other words, because a failed motor will typically be replaced, it is not necessary to know what the cause of the failure is, only that there is a failure. Therefore, it is desirable to provide a technique for monitoring the degradation of a vehicle electric motor during vehicle operation that does not require fast sampling rates.

SUMMARY OF THE INVENTION

In accordance with the teachings of the present invention, a system and method are disclosed for determining the health of a DC motor, such as a DC motor on a vehicle. The method includes measuring a current output signal of the DC motor, determining a mean of the measured current signal over a predetermined time period and determining a variance estimation of the mean of the measured current. The method then uses the variance estimation to determine the health of the motor, including an end-of-life prediction of the motor, and uses the mean of the measured current to determine the performance (torque) of the motor.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for determining faults and wear on an electric motor is merely exemplary in nature, and is in no way intended to limit the invention or its applications or uses. For example, the present invention has particular application for determining faults and wear on an electric motor in a vehicle. However, as will be appreciated by those skilled in the art, the system and method of the invention will have application for other motors not specifically on vehicles.

The present invention proposes a technique for monitoring DC motor wear during operation of the motor by monitoring the mean and variance of an output of the motor, such as motor current, over time. As the DC motor degrades and the variance of the output increases, the technique provides a health monitoring status of the motor so that once the degradation reaches a predetermined threshold, the motor can be replaced. Although current is the output signal of the motor that would usually be monitored to determine the variance, other outputs of the motor can also be used, such as motor torque. Further, the technique for monitoring the variance of the motor output has application for all types of DC motors, such as brush type motors, brushless motors, permanent magnet motors, wound excitation motors, etc.

Figure 1:
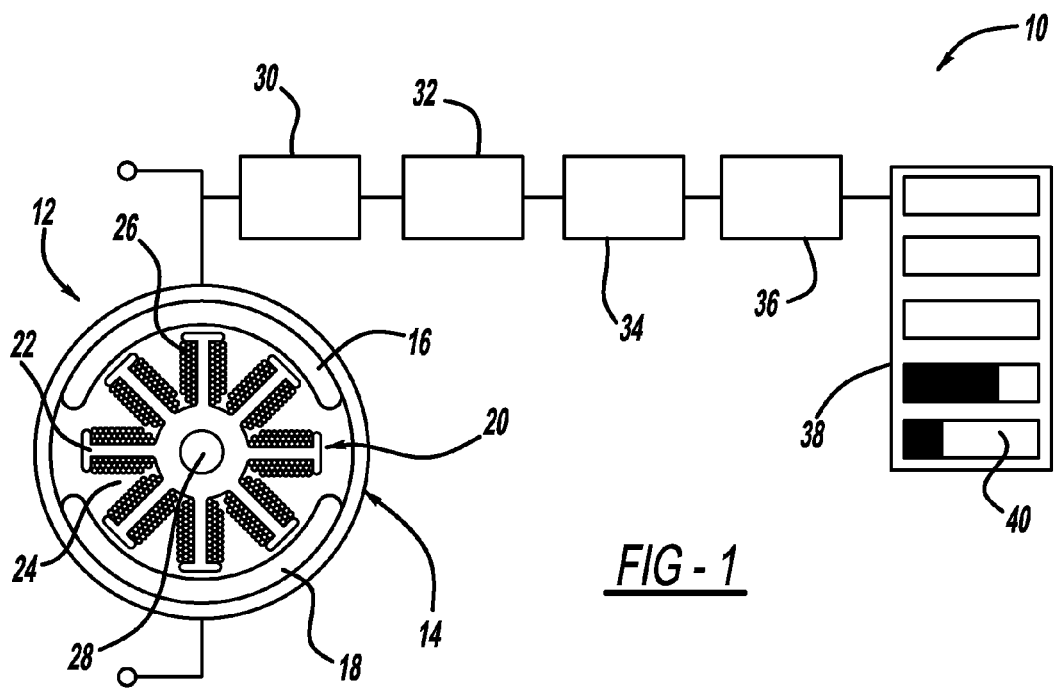
FIG. 1 is a block diagram of a DC motor fault diagnosis and prognosis system.

FIG. 1 is a block diagram of a DC motor fault diagnosis and prognosis system 10. The system 10 shows a DC motor 12 whose health is being monitored over time consistent with the discussion herein. As mentioned above, the motor 12 can be any DC motor, such as a brush type motor, brushless motor, permanent magnet motor, wound excitation motor, etc. In this non-limiting example, the motor 12 includes a stator 14 having permanent magnets 16 and 18. Further, the motor 12 includes a rotor 20 having a number of rotor segments 22, where each rotor segment 22 is separated by a slot 24, and where a coil 26 is wound around each segment 22. As is well understood by those skilled in the art, upon energizing the coils 26, the magnetic interaction between the coils 26 and the permanent magnets 16 and 18 causes the rotor 20 to rotate, which rotates a shaft 28 to provide work.

A current sensor 30 measures the current output of the motor 12 and provides that measurement to a low pass filter 32 to provide an online current average or mean, discussed in more detail below. The current average is then provided to another low pass filter 34 that provides a variance estimate of the current average, also discussed in detail below. The variance estimate is monitored by a health state processor 36 that determines the health of the motor 12 based on changes in the variance over time. The health state processor 36 provides an output to a health status indicator 38 that gives a level indication of the health of the motor 12 by bar indicators 40.

Figure 2:
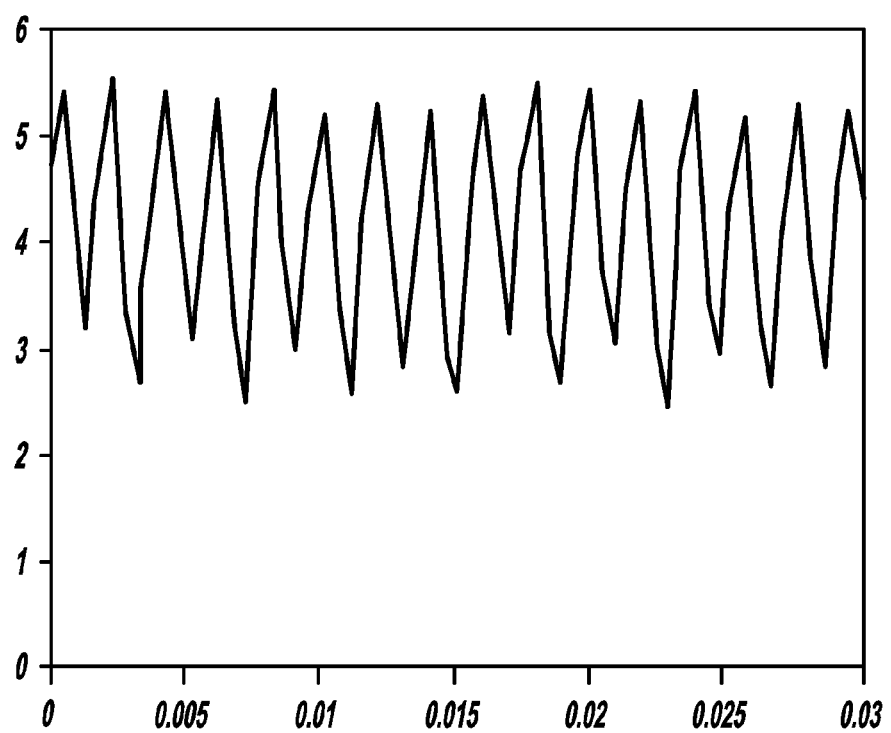
FIG. 2 is a graph with time on the horizontal axis and motor current on the vertical axis showing a current waveform output from a DC motor that is new and without faults.

FIG. 2 is a graph with time on the horizontal axis and motor current on the vertical axis showing a current output signal from a brush type DC motor having eight poles or segments, and where the motor is new with no faults. Each peak in the sinusoidal waveform representing the current output at a point where a brush makes contact to provide the electrical connection between the rotor and stator. The current signal is sinusoidal as the brushes change from one commutator or rotor segment to the next. As is apparent, the variance between the peaks in the waveform is relatively small.

Figure 3:
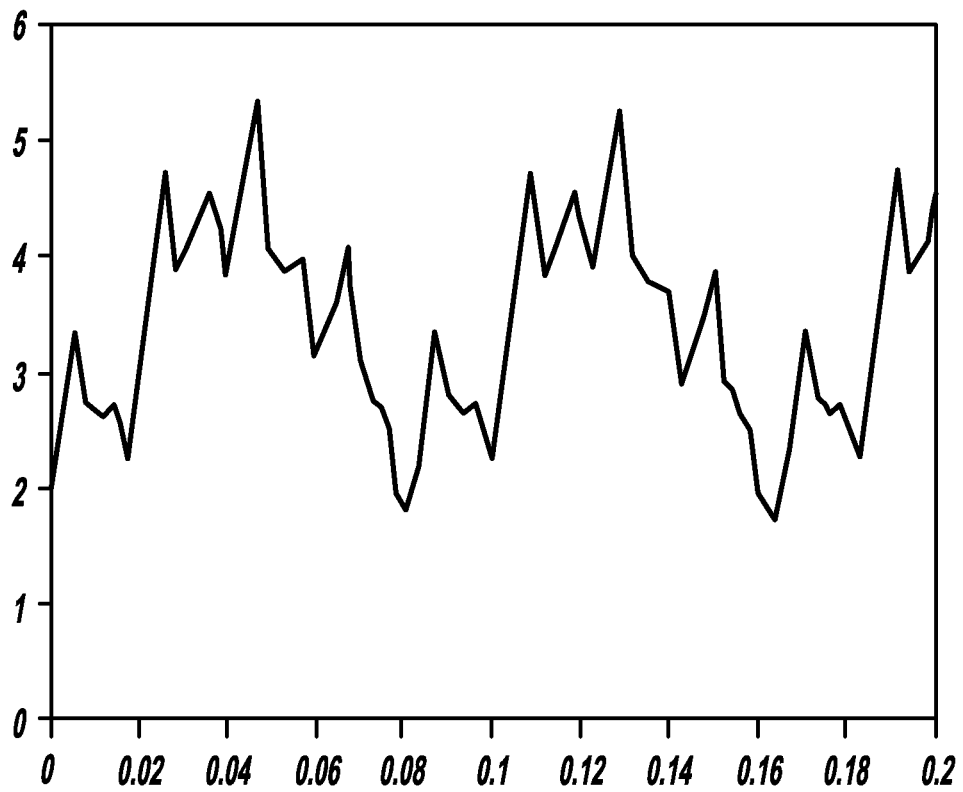
FIG. 3 is a graph with time on the horizontal axis and motor current on the vertical axis showing a current waveform output from a DC motor that is aged and has brush and commutator wear.

FIG. 3 is a graph with time on the horizontal axis and motor current on the vertical axis showing the same current output signal as in FIG. 2, but after the motor has aged and has both brush and commutator wear. It is apparent that the variance between the peaks in the sinusoidal waveform is now significant. That variance can be used to identify the level of wear on the motor to determine its health. For the worn motor, as shown in FIG. 3, distortions appear as the contact between the brushes and the commutator is lost.

Current variance is a measure of the amount of variation of the current. Consider a waveform to describe the current y given by a sinusoid waveform with a DC current offset $I_{DC}$, zero mean white noise η, as:

$$y = A\sin(wt) + I_{DC} + \eta \quad (1)$$

The variance of the current y is given by $A^2/2$. Note that this is only a function of the amplitude of the sinusoid signal not the frequency. It is also invariant to the constant current offset $I_{DC}$ on the signal. Thus, the current output of the motor is better approximated by:

$$y = I_{DC} + A\sin(wt) + E\sin(wt/8) + \eta \quad (2)$$

The eccentricity of the current y is captured by $E\sin(wt/8)$. In this case, the variance σ is:

$$\sigma = A^2/2 + E^2/2 \quad (3)$$

If the eccentricity is 10% of the value of A, then the variance is 1% affected. Gaussian white noise with a standard deviation of 10% of A gives a variance of 2%.

Variance has many benefits over other techniques, such as wavelets and Fourier transforms, including computational simplicity, the variance is not a function of motor speed, the variance is affected by the amplitude and the shape of the waveform, the standard deviation is squared, there are no requirements for fast sampling or complex signal processing tools (FFTs, wavelets), and variance is a non-negative quantity so it can directly be used as a performance function.

The definition of variance σ for a variable x is given by:

$$\sigma^2 = \frac{1}{N}\sum_{i=1}^{N}(x_i - \mu)^2 \quad (4)$$

Where the mean μ is:

$$\mu = \frac{1}{N}\sum_{i=1}^{N} x_i \quad (5)$$

Sampling this signal provides an unbiased sample variance σ as:

$$\sigma^2 = \frac{1}{n-1}\sum_{i=1}^{N}(x_i - \mu)^2 \quad (6)$$

The estimate of the variance a of the current signal can be obtained off-line by sampling the motor and calculating the sample variance for a batch of data. This can be repeated at regular intervals to determine how the variance changes. Several approaches have been developed in the art to obtain an estimate of a variance on-line moving average. For the variance of a random variable X, with an expected value (mean) defined as μ=E[X], then:

$$\text{Var}(X) = E[(X-\mu)^2] \quad (7)$$

The variance is the expected value of the squared difference between the variable and its mean value. The mean or expected value can be approximated and obtained on-line by a low-pass filter. Expanding the variance of the variable X gives:

$$\begin{aligned}\text{Var}(X) &= E[(X-\mu)^2] \\ &= E[X^2 - 2\mu X + \mu^2] \\ &= E[X^2] - 2\mu E[X] + \mu^2 \\ &= E[X^2] - 2\mu^2 + \mu^2 \\ &= E[X^2] + \mu^2 \\ &= E[X^2] - (E[X])^2\end{aligned} \quad (8)$$

As shown in equation (8), the variance is equal to the mean of the square minus the square of the mean. This can be implemented in the same manner using low-pass filters, but it less computationally efficient requiring an additional squared term.

Figure 4:
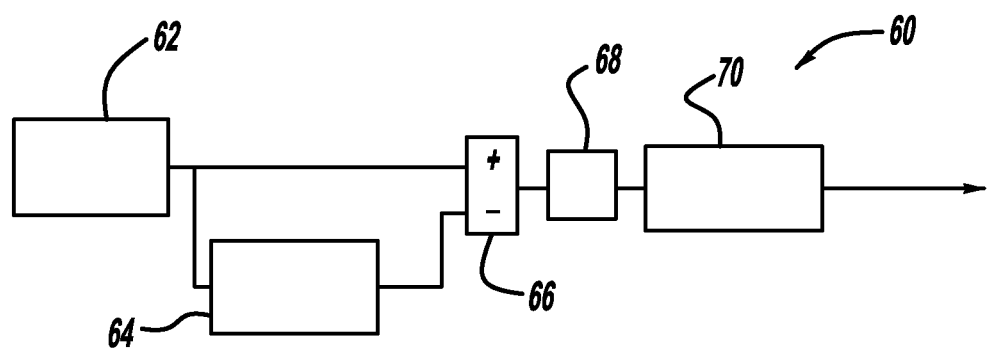
FIG. 4 is a block diagram of a system for providing an online moving motor current variance estimate.

Using the equations for the variance X in equation (9), a system can be devised to identify the variance. FIG. 4 is block diagram of a system 60 for determining an on-line moving variance estimate based on a measured current signal from the motor 12. Box 62 represents the current sensor 30. For the top line in equation (8), the current is low pass filtered by a filter 64, and then subtracted from the current by subtractor 66. That difference is then squared at box 68 and the square of the difference is again low-pass filtered by filter 70 to give the variance estimate.

Figure 5:
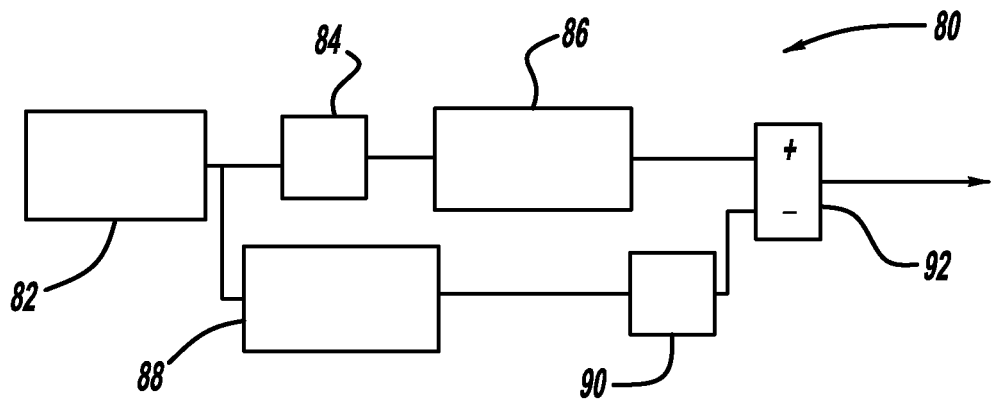
FIG. 5 is a block diagram of another system for providing an online moving motor current variance estimate.

For the bottom line in equation (8), a system 80 shown in FIG. 5 can be used to estimate the on-line moving variance estimate. Once again, the current sensor 30 is represented at box 82, and is squared at box 84 and low passed filtered at box 86 to give the left term in the equation. The current is also low-pass filtered by at box 88, which is then squared at box 90 to give the right term of the equation. Those values are then subtracted at box 92 to give the on-line moving variance estimate.

The following non-limiting discussion considers a computationally simpler approach using low pass filters as shown by the system 80 in FIG. 5. First, an exponentially weighted moving average is used to estimate the mean current value $\hat{I}_{mean}$ as:

$$\hat{I}_{mean}(k+1) = \lambda_1 \cdot \hat{I}_{mean}(k) + (1-\lambda_1) I^{measured}(k) \quad (9)$$

Where $I^{measured}(k)$ is the current sensor measurement at time k.

The estimate of the mean is removed from the current signal. The result is then squared and used to calculate an exponentially weighted moving variance $\hat{I}_{Var}$ as:

$$\hat{I}_{Var}(k+1) = \lambda_2 \cdot \hat{I}_{Var}(k) + (1-\lambda_2)(I - \hat{I}_{mean}(k))^2 \quad (10)$$

Where $\hat{I}_{Var}(k+1)$ is the new estimated value of the current variance at time interval (k+1).

The resulting approximate variance estimate $\hat{I}_{Var}^{new}$ can be tuned using the parameters $\lambda_1$ and $\lambda_2$ to determine how fast changes in the variance take place. One important aspect is that the sampling rate should be a non-integer multiple of the speed of the motor, otherwise the waveform would always be sampled at the same positions in the current waveform.

Figure 6:
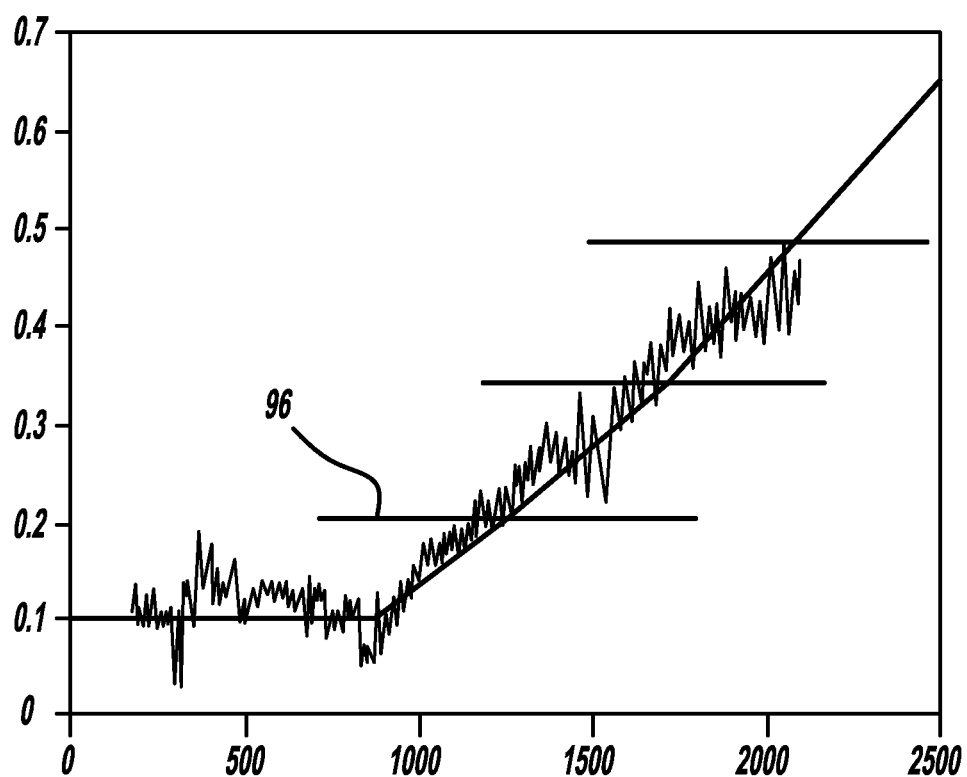
FIG. 6 is a graph with sample number on the horizontal axis and motor current variance on the vertical axis showing the current variance of a DC motor during an accelerated aging test.

An accelerated aging experiment was conducted for a DC motor. The variance of the current signal was measured at regular sample intervals for the motor. The motor was subjected to a constant voltage above the design specifications of the motor to accelerate the aging process. FIG. 6 is a graph with sample number on the horizontal axis and motor current variance on the vertical axis showing the results of the experiment. The first 100 samples are not shown because the motor was in a bedding period. As can be seen, the variance of the current remains low until around 900 samples where it starts to increase. The experiment was run for 2100 sample durations with no observed loss of performance of the motor.

The variance of the current can be used to diagnose the motor state of health by dividing the current variance into different regions. An estimate of the health of the motor can then be determined by observing which region the value of the current variance falls. Several values would need to be obtained because the variance estimate can be seen to fluctuate.

A method is developed below to formalize this observation and is performed at the box 36 in the system 10. This method is generic in the sense it can be applied to any signal with any number of health states. First, the region of the current variance is divided into different operating regions, for example, five regions 1-5, as:

Region 1 $\hat{I}_{Var} < X_{min}$
Region 2 $X_{min} \leq \hat{I}_{Var} \leq X_2$
Region 3 $X_2 \leq \hat{I}_{Var} \leq X_3$
Region 4 $X_3 \leq \hat{I}_{Var} \leq X_{max}$
Region 5 $\hat{I}_{Var} > X_{max}$ Where, for example, $X_{min}=0.2$, $X_2=0.35$, $X_3=0.5$, $X_{max}=0.8$ and $\alpha=0.1$.

Lines 96 in FIG. 6 show the transition from one region to another, and the bars 40 in the system 10 provide an indication of which region the state of health of the motor is in. A discrete probability function p is defined over these regions. The probability p represents a health assessment estimate that the motor is operating in that region. For instance, a new motor will have the initial distribution set to [1, 0, 0, 0, 0] since the current variance will be in region 1.

The probabilities p are updated at each iteration interval. If the current variance is in the range of the $i^{th}$ health state, then:

$$p^{new}(i) = p^{old}(i) + \alpha(1 - p^{old}(i)) \quad (11)$$

Where $\alpha$ is an update parameter less than 1, such as 0.001. Otherwise $k \neq i$, and:

$$p^{new}(k) = (1-\alpha) p^{old}(k) \quad (12)$$

Also the following constraint is imposed.

$$\Sigma p^{new} = \Sigma p^{old} = 1 \quad (13)$$

While the above discussion can be used as an indicator of the health of a DC motor and can even be used to determine that the motor is near the end of its life, it does not provide an indication of the remaining useful life of the motor. To estimate the remaining useful life from the accelerated aging test results, a technique is needed of mapping from the accelerated aged data to that obtained on the actual motor whose life is being estimated.

An approximate model is fitted to the accelerated aging experiential data. The data gives no indication of failure until around sample 900 where the variance begins to increase. An exponential curve can be fitted to the data from that point using standard regression technique as:

$$y = c - e^{k(x-900)} \quad (14)$$

Where x is the current sample and k is 0.00374.

The aim is to use the model to determine the time of transition from one region to another. The time when the motor transitions from region 1 to region 2 and from region 2 to region 3 is recorded. It is known how long the motor was in region 2 for the actual motor and this can be provided as a ratio against the test data. The data can be extrapolated using the model to give an indication of how long it will take for the variance to get to a level that is consider to be the end-of-life of the motor.

It has been shown that by monitoring the mean and variance of the current, at a given voltage, an assessment of the electric machine's health, such as appearance, severity of faults, wear, etc., can be made. The progression of the mean and variance features can be fed into a health state estimator, which can give an indication of remaining useful life, such as follows.

1. Variance of current can be used as an indicator of the state of health of a DC motor. It can also be used to as a prognosis and for remaining useful life of a DC motor.

2. A simple method to estimate (exponentially weighted moving) variance on-line using low pass filters.

3. A probabilistic method for determining the current health status of a DC motor that can be scaled to include as many different health regions as required.

4. An accelerated aging test for a DC motor.

5. A method to use the accelerated aging tests and the health regions to determine the remaining useful life of a DC motor.

This single measure should not be used in isolation, but combined with other indicators of motor health. Changes in the variance of the current signal may be caused by external components connected to the motor, such as the gear box or changes in the applied load. Parameter estimation can be used to determine changes in the motor resistance and back EMF. This can also be done online and does not require high sampling rates.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining health of a DC motor, said method comprising:
    observing a parameter output of the DC motor;
    determining a variance estimation and a mean estimation of the parameter output of the motor over a predetermined time period; and
    determining the health of the motor using the variance estimation and determining performance of the motor using the mean estimation.

2. The method according to claim 1 wherein observing the parameter output of the DC motor includes observing a motor torque.

3. The method according to claim 1 wherein observing the parameter output of the DC motor includes measuring a current signal from the DC motor.

4. The method according to claim 1 wherein determining a variance estimation of the parameter output includes using the mean estimation of the parameter output to determine the variance estimation.

5. The method according to claim 4 wherein determining a mean estimation of the parameter output includes low-pass filtering the parameter output.

6. The method according to claim 4 wherein determining a variance estimation includes subtracting the parameter output from the mean estimation of the parameter output, squaring a difference between the parameter output and the mean estimation of the parameter output, and low-pass filtering the squared difference between the parameter output and the mean estimation of the parameter output.

7. The method according to claim 4 wherein determining a variance estimation includes squaring the parameter output, low-pass filtering the squared parameter output, low-pass filtering the parameter output, squaring the low-pass filtered parameter output and subtracting the low-pass filtered square of the parameter output and the square of the low-pass filtered parameter output.

8. The method according to claim 1 further comprising performing an aging experiment on an experimental DC motor in a laboratory, identifying changes in an experimental variance estimation of the parameter output of the experimental DC motor during the aging experiment and separating the experimental variance estimation into a number of regions where each region defines a different state of health of the experimental DC motor.

9. The method according to claim 8 wherein determining the health of the motor includes using a probability function to determine in what region the variance estimation of the parameter output of the motor falls.

10. The method according to claim 9 further comprising using data from the aging experiment and a model to determine when the motor will transition from one region to the next to determine an end of life of the motor.

11. The method according to claim 1 wherein the motor is selected from the group consisting of brush type motors, brushless motors, permanent magnet motors and wound excitation motors.

12. The method according to claim 1 wherein the motor is on a vehicle.

13. A method for determining health of a DC motor on a vehicle, said method comprising:
    measuring a current output signal from the DC motor;
    determining a mean estimation of the measured current output signal over a predetermined time period;
    determining a variance estimation of the measured current output signal using the mean estimation of the measured current output signal;
    determining the health of the motor using the variance estimation, wherein determining the health of the motor includes determining a probable end-of-life of the motor; and
    determining performance of the motor using the mean estimation.

14. The method according to claim 13 wherein determining a mean estimation of the measured current output signal includes low-pass filtering the measured current output signal.

15. The method according to claim 14 wherein determining a variance estimation includes subtracting the measured current output signal from the mean estimation of the measured current output signal, squaring a difference between the measured current output signal and the mean estimation of the measured current output signal, and low-pass filtering the squared difference between the measured current output signal and the mean estimation of the measured current output signal.

16. The method according to claim 14 wherein determining a variance estimation includes squaring the measured current output signal, low-pass filtering the squared measured current output signal, low-pass filtering the measured current output signal, squaring the low-pass filtered measured current output signal and subtracting the low-pass filtered and square of the measured current output signal and the square of the low-pass filtered measured current output signal.

17. A system for determining health of a DC motor on a vehicle, said system comprising:
    means for measuring a current output signal from the DC motor;
    means for determining a mean estimation of the measured current output signal over a predetermined time period;
    means for determining a variance estimation of the measured current output signal using the mean estimation of the measured current output signal;
    means for determining the health of the motor using the variance estimation; and
    means for determining performance of the motor using the mean estimation.

18. The system according to claim 17 wherein the means for determining a mean estimation of the measured current output signal low-pass filters the measured current output signal.

19. The system according to claim 18 wherein the means for determining a variance estimation subtracts the measured current output signal from the mean estimation of the measured current output signal, squares a difference between the measured current output signal and the mean estimation of the measured current output signal, and low-pass filters the squared difference between the measured current output signal and the mean estimation of the measured current output signal.

20. The system according to claim 18 wherein the means for determining a variance estimation squares the measured current output signal, low-pass filters the squared measured current output signal, low-pass filters the measured current output signal, squares the low-pass filtered measured current output signal and subtracts the low-pass filtered square of the measured current output signal and the square of the low-pass filtered measured current output signal.

\* \* \* \* \*